(12) United States Patent
Lemoff et al.

(10) Patent No.: US 6,259,121 B1
(45) Date of Patent: Jul. 10, 2001

(54) MONOLITHIC MULTIPLE WAVELENGTH VCSEL ARRAY

(75) Inventors: Brian E. Lemoff, Union City; Dubravko Babic, Sunnyvale; Richard P. Schneider, Mountain View, all of CA (US)

(73) Assignee: Agilent Technologies, Inc.

( * ) Notice: Subject to any disclaimer, the term of this patent is extended or adjusted under 35 U.S.C. 154(b) by 0 days.

(21) Appl. No.: 09/397,621

(22) Filed: Sep. 16, 1999

Related U.S. Application Data

(62) Division of application No. 09/058,532, filed on Apr. 10, 1998.

(51) Int. Cl.$^7$ .................................................. H01L 33/00
(52) U.S. Cl. ................................. 257/88; 257/14; 257/82; 257/89; 438/34; 438/35; 372/23; 372/45; 372/50
(58) Field of Search .................... 372/23, 50, 45; 438/35, 34; 257/14, 82, 88, 89

(56) References Cited

U.S. PATENT DOCUMENTS

| | | | |
|---|---|---|---|
| 5,293,392 | * | 3/1994 | Shieh et al. ............................ 372/45 |
| 5,351,257 | * | 9/1994 | Lebby et al. ........................... 372/46 |
| 5,557,626 | * | 9/1996 | Grodzinski et al. .................... 372/45 |
| 5,557,627 | * | 9/1996 | Schneider, Jr. et al. ............... 372/46 |
| 5,624,529 | * | 4/1997 | Shul et al. ............................ 438/718 |
| 5,677,924 | * | 10/1997 | Bestwick .............................. 372/96 |
| 5,699,375 | * | 12/1997 | Paoli ..................................... 372/50 |
| 5,838,707 | * | 11/1998 | Ramdani et al. ...................... 372/45 |
| 5,864,575 | * | 1/1999 | Ohiso et al. .......................... 372/96 |
| 5,898,722 | * | 4/1999 | Ramdani et al. ...................... 372/50 |
| 5,963,568 | * | 10/1999 | Paoli ..................................... 372/23 |
| 6,044,100 | * | 3/2000 | Hobson et al. ....................... 372/46 |
| 6,117,699 | * | 9/2000 | Lemoff et al. ........................ 438/35 |

FOREIGN PATENT DOCUMENTS

549167A2 * 6/1993 (EP) ............................. H01S/3/085

\* cited by examiner

*Primary Examiner*—Eddie C. Lee
*Assistant Examiner*—Eugene Lee
(74) *Attorney, Agent, or Firm*—Pamela Lau Kee

(57) ABSTRACT

An array of n-wavelength vertical cavity surface emitting lasers (VCSELs) can be grown with precise and repeatable wavelength control. First, a foundation VCSEL structure is grown on a substrate. Next, n-paired layers of AlGaAs and InGaP are grown, where n is the desired number of different wavelengths. Next, one of the n regions is masked and etched. The steps of masking and etching are repeated until all n regions are etched. Finally, the upper VCSEL structure is grown.

6 Claims, 4 Drawing Sheets

MONOLITHIC MULTIPLE WAVELENGTH VCSEL ARRAY

CROSS REFERENCE TO RELATED APPLICATION(S)

This is a divisional of copending application U.S. Ser. No. 09/058,532 filed on Apr. 10, 1998.

FIELD OF THE INVENTION

The invention is directed towards laser manufacturing. In particular, the invention applies towards the field of vertical cavity surface emitting lasers.

BACKGROUND OF THE INVENTION

In a vertical cavity surface emitting laser (VCSEL), the lasing wavelength is determined by the length of a Fabry-Perot cavity formed by two distributed Bragg reflectors (DBRs) separated by a semiconductor cavity that includes layers with optical gain. The optical gain in a VCSEL is typically provided by quantum wells. Each quantum well has a gain spectrum with a single peak wavelength, and some spectral width over which gain is present. Each DBR is composed of quarter wave layers of alternating high and low refractive indices. The DBR reflectivity is characterized by a complex amplitude and phase spectrum. The amplitude spectrum exhibits a high reflectivity region at the center of which the reflectivity is highest. The width of the high reflectivity region is referred to as the DBR stop-band width. The phase characteristic of the DBR varies approximately linearly over the stop-band width. The lasing wavelength of a VCSEL is determined by the optical length of the semiconductor cavity and the phase characteristics of the DBRs. The gain provided by the active layer, necessary to achieve lasing (threshold gain) is determined by the round-trip cavity loss that includes material absorption and the DBR transmission. A monolithic multiple-wavelength VCSEL array requires side-by-side fabrication of VCSELs with varying lasing wavelengths, but otherwise uniform laser characteristics: threshold gain and current, and efficiency. This implies that the vertical structure of the lasers must vary from device to device on the same wafer, while the cavity losses, material gain, and the DBR transmission remain largely unchanged. The lasing wavelength variation is most commonly realized by changing the optical length of the semiconductor cavity.

One prior art method to making a monolithic multiple wavelength VCSEL array is non-uniform growth due to thermal gradient. The backside of a substrate is patterned prior to epitaxial growth in an MBE reactor. The resulting backside pattern produces a thermal gradient on the surface of the substrate when the wafer is heated. Because growth rate is temperature dependent, there is a variable material thickness and hence a variable laser wavelength along the thermal gradient. One disadvantage of this approach is the fact that the arrays are limited to linear geometries. To date, it has been difficult to control the wavelengths precisely and repeatably over large areas of the wafer.

An alternate prior art method is laterally confining each laser prior to epitaxial growth by either etching a mesa or patterning windows in an oxide mask. This process is known as "selective area growth". Growth rate and composition are functions of lateral dimension. The method is sensitive to growth conditions and may vary from reactor to reactor or from growth to growth. In both of the aforementioned prior art methods, the proximity of different wavelength devices in an array is limited.

Another prior art method is to grow a partial VCSEL structure including the lower DBR, the active region, and some part of the upper DBR. The wafer is masked and anodically oxidized to some controlled oxide thickness over the exposed portions. A selective etch is then used to remove the oxide. This process is repeated to create different effective cavity lengths for each laser in an array. The remainder of the VCSEL structure is regrown over the patterned wafer. Each etch is sensitive to voltage and concentration variations that may affect the depth, resulting in reduced control over wavelength spacing between devices.

A method that is insensitive to fabrication process variations, and has the same accuracy as the planar epitaxial growth used to fabricate the laser mirrors and the active layer, is preferred for fabrication of multiple-wavelength VCSEL arrays. Such a method should also allow for design flexibility in device spacing and geometry within the array.

SUMMARY OF THE INVENTION

An array of vertical cavity surface emitting lasers (VCSELs) having n different wavelengths can be fabricated with precise and repeatable wavelength control. First, a partial VCSEL layer structure is grown on a substrate. Next, n-paired layers of AlGaAs and InGaP are grown, where n is the desired number of different wavelengths. Next, a region is masked and etched. The steps of masking and etching are repeated until all necessary regions are defined. Each region defines a different optical thickness for n different wavelength VCSELs. Finally, the upper VCSEL layer structure is grown. An active region can be included with a novel quantum well structure to produce a broad gain spectrum to allow lasing over a wide range of wavelengths.

DETAILED DESCRIPTION OF THE DRAWINGS

Figure 1:
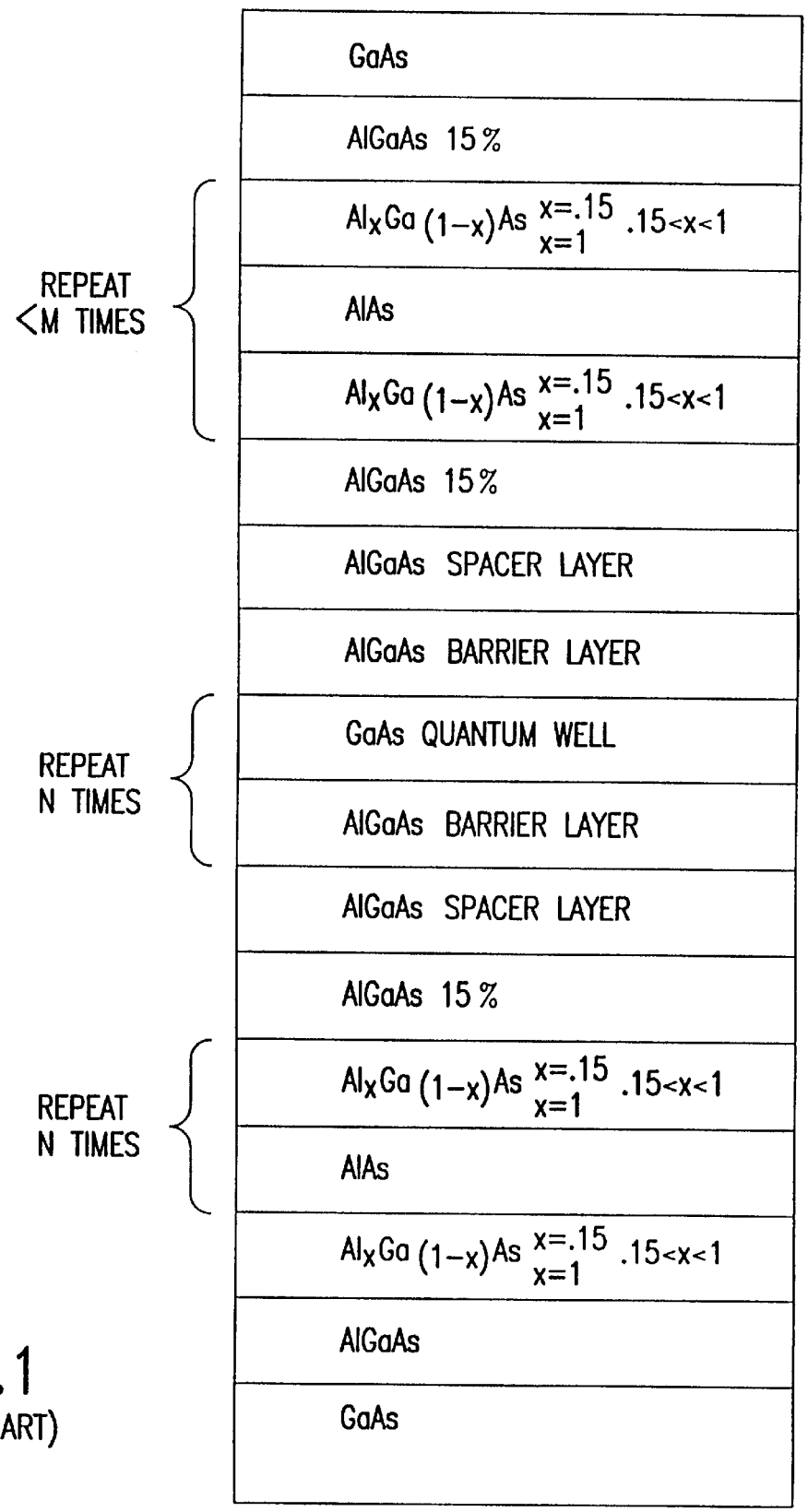
FIG. 1 illustrates a typical vertical cavity surface-emitting laser.

FIG. 1 illustrates a typical VCSEL layer structure 100 that includes a lower DBR fabricated on a substrate, e.g. a GaAs wafer. Next, a first space layer, e.g. AlGaAs, is grown over the lower DBR. A series of AlGaAs layers that are interposed by quantum well layers of GaAs form the cavity region. The layers of AlGaAs act as barrier layers. A second space layer is fabricated over the cavity region. Finally, an upper DBR is fabricated over the second space layer. A GaAs contact layer that is heavily doped is grown over the top DBR.

Each DBR includes a layer of AlAs. A series of alternating layers of $Al_xGa_{1-x}As$ $0.15 < x < 1$ and AlAs are fabricated over the layer of AlGaAs. The number of layers depends upon the desired level of reflectivity. Generally, the upper DBR includes fewer layers than the lower DBR because it must have a higher transmissivity for light output coupling.

Figure 2:
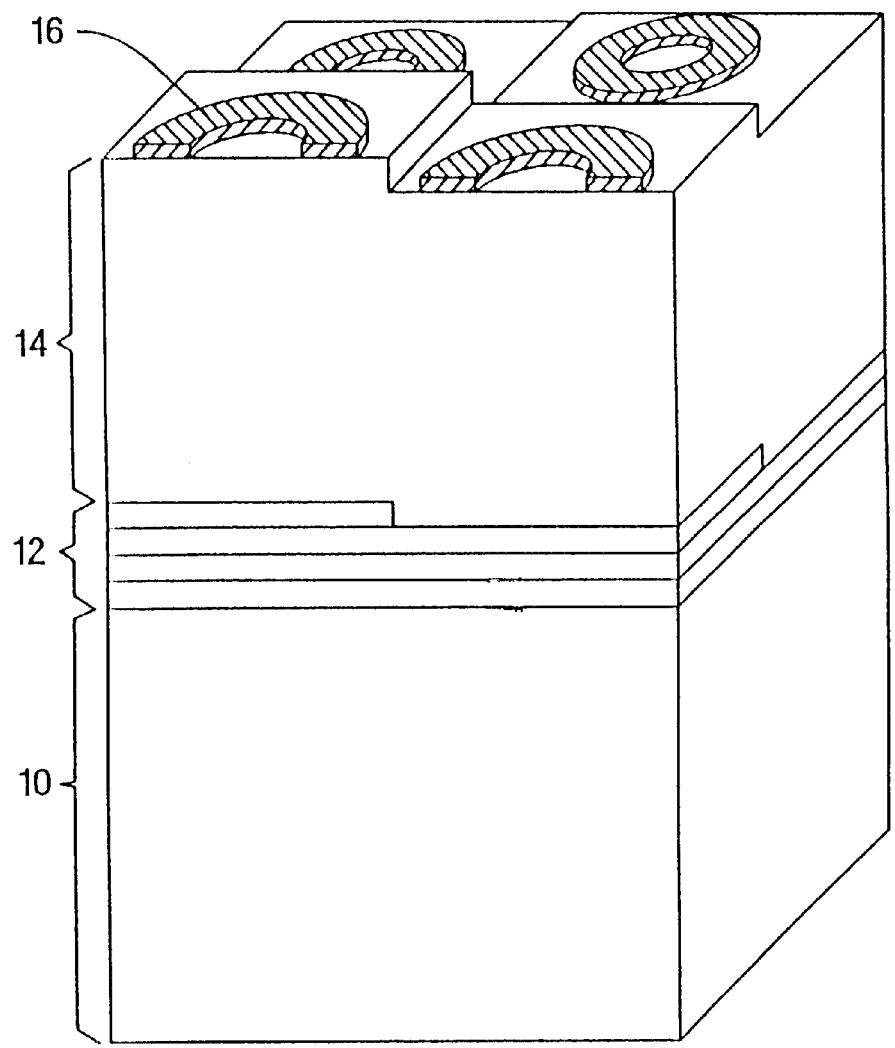
FIG. 2 illustrates a VCSEL array of the present invention.

FIG. 2 illustrates a VCSEL layer structure 100 of the present invention. The lower portion of the VCSEL layer structure 10 is fabricated in a single epitaxial growth. This growth includes the lower DBR and the cavity region. In addition to the active layers grown in the cavity region are alternating layers of selectively etchable semiconductors 12, forming an etch-stop superlattice. In the preferred embodiment, these layers are InGaP and AlGaAs, where the final layer grown is AlGaAs. Following growth, the wafer is removed from the reactor and one or more patterned etches are performed. The upper DBR 14 is fabricated over the etch-stop superlattice 12. A contact layer 16, e.g. GaAs, is placed over the upper DBR 14.

Figure 3:
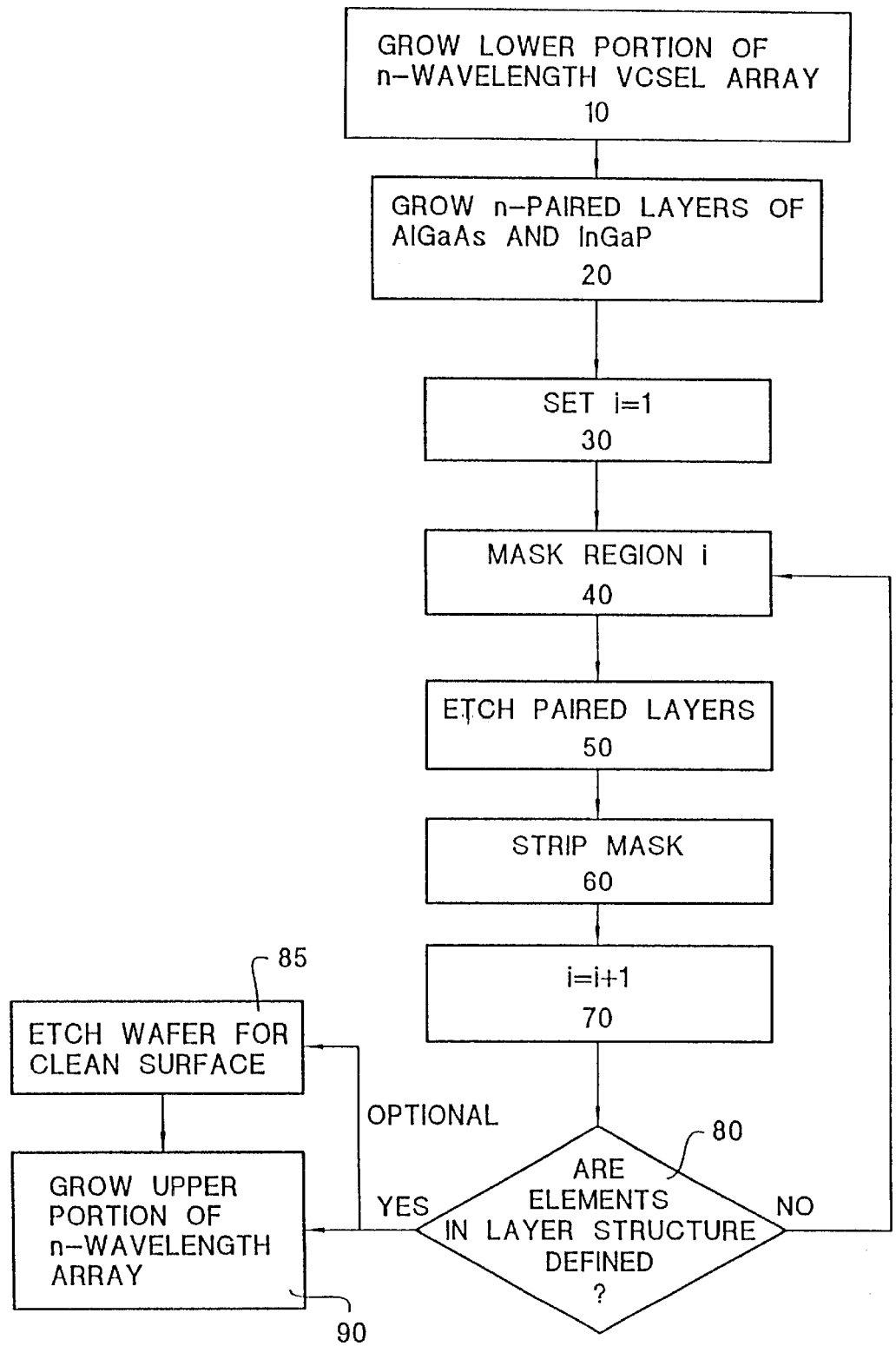
FIG. 3 is a flow chart that corresponds to FIG. 2.
Figure 4:
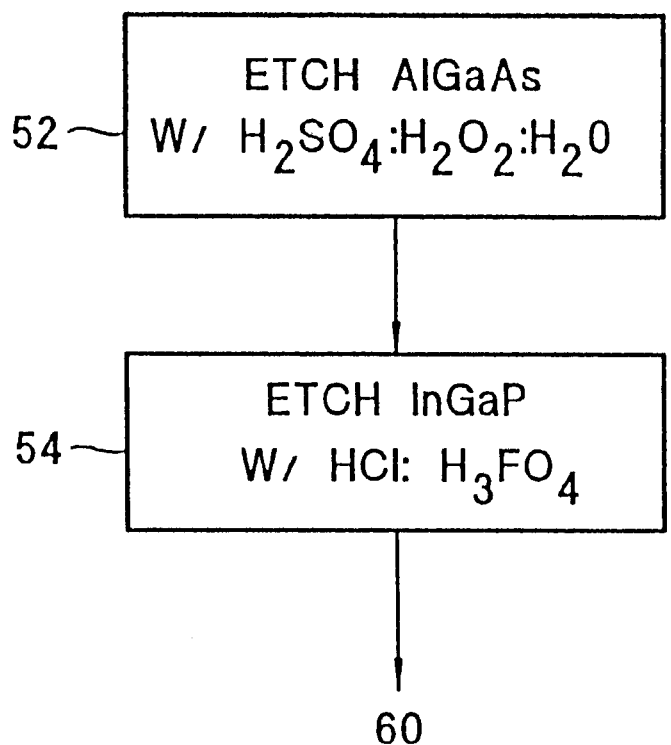
FIG. 4 is a flow chart that corresponds to step 20.

FIG. 3 is a flow chart that corresponds to fabricating FIG. 2. In step 10, the lower VCSEL structure is grown. In step 20, n-paired etch-stop layers, e.g. AlGaAs and InGaP, are grown. The etch-stop layers are selected from a group that includes AlGaAs, InP, InGaAsP, GaAs, and InP. In step 40, an etch-mask is applied to the wafer so that only a part of the wafer is etched. In step 50, one of the n-paired layers is etched. In the preferred embodiment (shown in FIG. 4), the top layer is etched at a higher rate than the second layer. In step 52, the first etch is 1 part sulfuric acid, 1 part hydrogen peroxide, and 25 parts water. This solution will etch the top layer (AlGaAs) but will not etch the second layer (InGaP). In step 54, a second etch is selected that will etch the second layer at a higher rate than the third layer. The second etching solution is 1 part hydrochloric acid and 2 parts phosphoric acid. In this manner, a pair of layers in the etch-stop superlattice is precisely etched over a defined region of the wafer. In step 70, the etch-mask is stripped. Steps 40–70 are repeated until all of the desired regions have been etched. Since the etching occurs in pairs, the top layer in any region of the wafer will always be of the same composition as the original top layer following the epitaxial growth.

Although the embodiment preferably uses paired etch stop layers having different etch rates, the etch-stop region may be fabricated in a single growth, where the region is divided into sub-layers. Each sub-layer may be etched similar in the aforementioned manner such that each VCSEL has a different wavelength.

In a preferred embodiment, each VCSEL has four elements (shown in FIG. 2). During the first patterned etch sequence, the second and fourth elements have one pair of layers etched. During the second patterned etch sequence, the third and fourth elements have two pairs of layers etched. This results in elements 1, 2, 3, and 4 having 0, 1, 2, 3, etched pairs, respectively. Different numbers of etched layers result in different cavity lengths and hence different wavelengths.

Prior to regrowth, the entire wafer is exposed to an etchant that removes the top layer. This ensures a clean and uniform top layer that has not been in contact with photoresist, and has been exposed to the environment for a minimum amount of time. In the preferred embodiment, an AlGaAs layer is removed, resulting in a clean InGaP surface upon which the regrowth will occur. Because InGaP oxidizes more slowly than AlGaAs, it is a better surface upon which to perform a regrowth.

The wafer is then returned to the reactor, where the remainder of the VCSEL structure is grown. This includes the top DBR and the contact layer. Following regrowth, the wafer is processed according to known methods for fabricating VCSELs. When processing the wafer, each laser array is aligned such that each laser in the array is situated in a region of the wafer that has had a different number of pairs etched. Thus, each laser in the array has a different cavity length and will thus have a different lasing wavelength.

In a VCSEL, lasing occurs when the round trip cavity gain exceeds the combined mirror transmissivity and the optical loss due to absorption and scattering. The wavelength range over which lasing can occur is typically limited by the gain-bandwidth of the multiple quantum well structure in the cavity. These structures typically consist of several identical quantum wells. The gain bandwidth can be increased using either chirped quantum wells or coupled quantum wells.

For a chirped quantum well structure, several quantum wells with different dimensions or compositions are present in the cavity. Since the quantum wells have different properties, they will have optical gain spectra peaked at different wavelengths. Since the gain bandwidth of the active region is determined by the sum of the spectra of the individual quantum wells, using different quantum wells will result in a higher gain bandwidth. This allows lasing at a more uniform threshold current over a wider wavelength range.

For a coupled quantum well structure, the barrier layers that separate the quantum wells from one another are thin and allow significant overlap between the eigenstate wavefunctions of the individual wells. This overlap results in energy splitting in the eigenstates for the coupled quantum well structure. Thus, the coupled states will have gain spectra peaked at different wavelengths. This in turn produces a wider gain bandwidth as in the chirped quantum well system. In addition to the bandwidth of the active region gain, there is another factor that increases the non-uniformity of threshold currents and laser efficiencies for lasers with different wavelengths. The reflectivity of both laser mirrors (DBRs) and the transmission of the output coupler are wavelength dependent. The reflectivity is highest at the center wavelength, while it reduces for all wavelengths away from the center. The transmission, on the other hand, is lowest at the center wavelength, and increases with the wavelengths away from the center. This means that devices with lasing wavelengths farthest from the center will exhibit higher threshold gain, and in turn higher threshold current. In order to keep the laser characteristics uniform, it would be advantageous to design the active region in such a way that the gain increases when the reflectivity decreases and/or transmission increases. The closer the gain can be tailored to track the DBR transmission, the more uniform the threshold current will be. The composition of a quantum well layer is selected from a group that includes GaAs, AlGaAs, AlInGaAs, InGaP, InGaAs, InGaAsP, and AlInGaP In a preferred embodiment, the lasers have wavelengths of 820, 835, 850, and 865 nm. A typical quantum well has a gain full width at half maximum (FWHM) of approximately 30 nm. Thus, if a quantum well were centered at 842.5 nm, the threshold current required at 820 nm and 865 nm would be much higher than at 835 nm and 850 nm. Furthermore, a typical AlGaAs/AlAs DBR structure centered at 842.5 nm has approximately twice the transmission at 820 nm and 865 nm than it does at 835 nm and 850 nm. This increases the threshold non-uniformity between the inner and outer wavelengths. In a preferred embodiment, the active region contains a chirped quantum well structure consisting of two quantum wells centered at 865 nm and two quantum wells centered at 820 nm. This structure has a gain spectrum that has a local minimum at 842.5 nm and peaks at 820 nm and 865 nm. This structure has broad gain and creates a gain spectrum that compensates for the DBR transmission spectrum, allowing a more uniform threshold current to be achieved.

We claim:

1. A vertical cavity surface emitting laser array comprising:

a unitary substrate; and a first and a second element positioned on the unitary substrate, each element including, a lower DBR positioned on the unitary substrate, a first space layer positioned on the lower DBR, m barrier layers, wherein m≧2, positioned over the first space layer, m-1 quantum well layers, wherein each quantum well layer interposes two of the m barrier layers, a second space layer, positioned over the m-1 quantum well layers, a series of etch stop layers, positioned over the second space layer, an upper DBR positioned over the series of etch stop layers, and a contact layer that is heavily doped, positioned over the upper DBR;

wherein first and second elements have dissimilar numbers of etch stop layers.

2. A vertical cavity surface emitting laser array, as defined in claim 1, wherein for the first element, one of the etch stop layers further includes two sublayers, wherein the one of the two sublayers is etched at a higher rate than the other of the two sublayers.

3. A vertical cavity surface emitting laser array, as defined in claim 2, wherein one of the two sublayers is AlGaAs and the other of the two sublayers is InGaP.

4. A vertical cavity surface emitting laser array, as defined in claim 1, wherein at least two of the m-1 quantum well layers are of unequal thickness.

5. A vertical cavity surface emitting laser array, as defined in claim 1, wherein at least two of the m-1 quantum well layers have different composition.

6. A vertical cavity surface emitting laser layer array, as defined in claim 1, further including a wavefunctions overlap between the m-1 quantum well layers.

* * * * *